United States Patent [19]

Henle et al.

[11] 4,426,689
[45] Jan. 17, 1984

[54] VERTICAL SEMICONDUCTOR INTEGRATED CIRCUIT CHIP PACKAGING

[75] Inventors: Robert A. Henle, Clinton Corners; Alfred H. Johnson, Poughkeepsie, both of N.Y.

[73] Assignees: International Business Machines Corporation, Armonk, N.Y.

[21] Appl. No.: 210,880

[22] Filed: Nov. 28, 1980

Related U.S. Application Data

[62] Division of Ser. No. 19,392, Mar. 12, 1979, Pat. No. 4,266,282.

[51] Int. Cl.[3] .............................................. G11C 5/04
[52] U.S. Cl. ..................................... 365/52; 361/398; 365/72
[58] Field of Search ................... 365/52, 72; 361/395, 361/397, 398, 399, 414, 415

[56] References Cited

U.S. PATENT DOCUMENTS

| | | | |
|---|---|---|---|
| 3,065,383 | 11/1962 | Guillemot | 361/398 |
| 3,341,742 | 9/1967 | Klehm | 361/398 |
| 3,469,953 | 9/1969 | St. Clair et al. | 361/398 |
| 3,766,439 | 10/1973 | Isaacson | 361/398 |
| 3,873,889 | 3/1975 | Leyba | 361/398 |
| 4,059,849 | 11/1977 | Mitchell | 361/395 |

FOREIGN PATENT DOCUMENTS

1355837  2/1964  France ............................... 361/414

OTHER PUBLICATIONS

Doo et al., "High Performance Package for Memory", IBM Tech. Disc. Bul., vol. 21, No. 2, 7/78, pp. 585-586.

Primary Examiner—Stuart N. Hecker
Attorney, Agent, or Firm—George O. Saile

[57] ABSTRACT

A semiconductor chip is so designed that the signal and power terminals are brought to one edge of the integrated circuit chip. The integrated circuit chip is then mounted vertically on a substrate which provides signal interconnection and power distribution to the integrated circuit chips as well as a thermal path for conducting heat away from the chips. The electrical connection from the semiconductor chip to the substrate may be by solder reflow or thermal compression bonding techniques. The package is particularly advantageous for memory integrated circuit chips. The vertical integrated circuit chips may alternatively be carried by a tape carrier which is formed into a convoluted form with all integrated circuit chips positioned substantially vertically thereon. This carrier is then bonded electrically and physically to a substrate in areas associated with the integrated circuit chips so that when the substrate is substantially horizontal the integrated circuit chips are substantially vertical in relation thereto. In this alternative, electrical connections may be made to more than one edges of the integrated circuit chips.

17 Claims, 17 Drawing Figures

VERTICAL SEMICONDUCTOR INTEGRATED CIRCUIT CHIP PACKAGING

This is a division of application Ser. No. 019,392 filed Mar. 12, 1979, now U.S. Pat. No. 4,266,282.

DESCRIPTION

TECHNICAL FIELD

This invention relates to integrated circuit chip packaging structures and methods for manufacturing the same, and more particularly, to vertical integrated circuit chip packages which are highly dense.

BACKGROUND ART

In microminature electronic circuitry, it is desirable that a large number of integrated circuit chips be packaged and interconnected so that they can perform functions in the minimum of time. Up until the present time integrated circuits have been virtually exclusively packaged on substrates with the integrated circuit chips parallel to the substrate. This type of structure has always seemed to be the only way of joining a semiconductor chip to a module when it is understood by those skilled in the art that the integrated circuit semiconductor chip size is of the order of hundreds of square mils on a side.

There has been attempts to increase the density of integrated circuit chips in a package by attaching a plurality of semiconductor chip carrying substrates vertically onto a main substrate. In this structure the semiconductor chips are vertically held and the density of the package in terms of integrated circuit chips has increased. Examples of these designs can be seen in the M. Bennett, et al U.S. Pat. No. 3,916,266, W. Anacker, U.S. Pat. No. 3,949,274, B. Agusta, et al IBM Technical Disclosure Bulletin Vol 10, No. 7, December 1967, pp. 890 and 891 and B. R. Kryaniwsky, IBM Technical Disclosure Bulletin Vol 14, No. 10, March 1972, page 2911.

The M. Bennett, et al patent describes a package for interconnecting a plurality of integrated circuit chips which includes a dielectric body having a plurality of intersecting planes and a plurality of metalized interconnection patterns located on the planes. The integrated circuit chips are mounted onto the metalized interconnecting patterns. These interconnecting patterns extend to a base member wherein terminals are provided for interconnection off of the package.

The Anacker patent describes a package for interconnecting superconductive circuitry of the Josephson type. Superconductive circuit chips are attached by solder reflow techniques to conductors formed upon a substrate which may be composed of silicon or glass or other suitable material, and this substrate is mounted on along with other superconducting circuit chip carrying substrates on a principal substrate.

The Agusta, et al IBM Technical Disclosure Bulletin describes a similar structure to that of Anacker for integrated circuits wherein the principal module substrate carries a plurality of chip carriers which have integrated circuit chips mounted thereon. This concept shows the interconnection of chip carriers by means other than the principal module substrate.

The Kryaniwsky IBM Technical Disclosure Bulletin shows a structure where semiconductor chips are mounted in a back-to-back relationship with an intervening air gap which acts as an air column for cooling purposes. The semiconductor chips are epoxy bonded to a chip support member for mechanical strength. The semiconductor chips are electrically connected to the principal substrate by means of conductive line of a printed circuit decal which is folded into a "U" shape so as to be able to contact the back-to-back chips.

SUMMARY OF THE PRESENT INVENTION

It is the object of the present invention to describe a structure wherein integrated circuit chips of the order of hundreds of mils by hundreds of mils on a side may be directly connected to a substrate to form a highly dense integrated circuit package.

It is a further object of this invention to provide a highly dense package for the organization of random access memory using one level of metallurgy wherein the integrated circuit memory chips are vertically mounted on the substrate to form a vertical memory package.

It is the further object of this invention to describe a vertical integrated circuit structure which utilizes a convoluted tape carrier structure for vertically carrying the integrated circuit chips on a horizontal substrate.

It is the still further object of this invention to provide a method for forming the convoluted tape carrier structure for vertically packaging small integrated circuit devices in a high density manner.

These numerated objects may be accomplished by providing a vertical semiconductor chip package which includes a principal substrate and semiconductor integrated circuit chips attached thereto. The semiconductor integrated chip has its signal and power terminals located on one edge of the chip. The electrical and physical connection of the integrated circuit chip to the substrate is at the one edge of the chip which has the signal and power terminals located thereon. The connection is to electrical paths on or in the substrate for signal interconnection and power distribution to and from the semiconductor chip. The connections may be by solder reflow, by means of thermal compression bonding, or the like. A support means such as a support frame holding the semiconductor chip at its side edges may be used in the method for bonding the integrated circuit chips to the principal substrate and can remain upon the substrate as a support frame for holding the chip edges to the substrate.

Alternatively, the integrated circuit chips may be bonded to a tape carrier. The tape carrier is formed in a convoluted form with all of the integrated circuits positioned substantially vertically thereon. The tape carrier is then electrically and physically bonded to the substrate in areas associated with the integrated circuit chips so that the substrate is substantially horizontal with respect to the vertically positioned integrated circuit chips in the structure. The integrated circuit chips are located in openings in the tape carrier with metal leads physically and electrically connected to the integrated circuit chips across the openings between the chip and the tape carrier. The metal leads may be physically and electrically connected between one or more of the sides of the plurality of integrated circuit chips on the tape carrier.

A vertical semiconductor memory integrated circuit chip package is a particular valuable one for a high density product. The plurality of memory chips carried on a single substrate which may contain only a single level of metallurgy may be organized into a random access memory structure by the connection of appropriate numbers of the memory chips to one another and to external module contacts through the conductive lines to provide the required bit address, data in (write), data out (read), column address select, row address select, ground and supply voltage for the memory organization. All memory chips are mounted vertically on the principal substrate.

DISCLOSURE OF THE INVENTION

Figure 1:
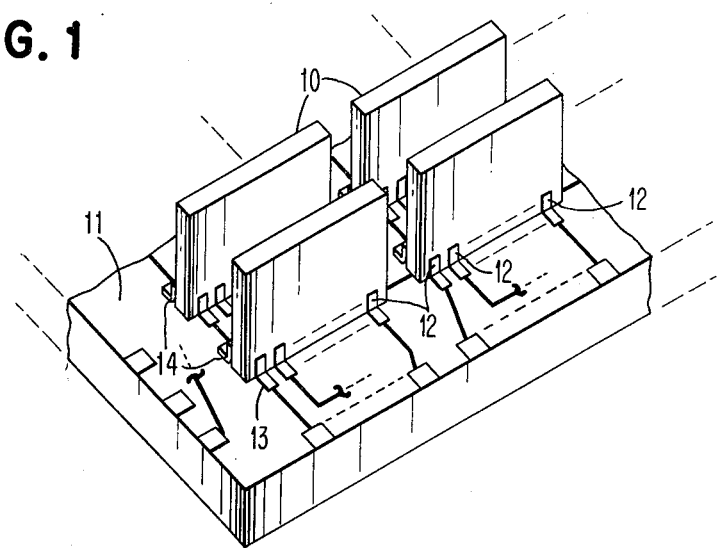
FIG. 1 Shows a greatly enlarged perspective view of a portion of the vertical chip package structure of the present invention.

Referring now more particularly to FIG. 1 there is shown a greatly enlarged schematic illustration of the vertical integrated circuit chip package of the present invention. Semiconductor chips 10 are physically and electrically connected to the substrate 11 at one edge of the semiconductor chip 10. All signal and power terminals 12 for each semiconductor chip are located on that one edge of the chip. Electrical conductors 13 are located on or in the substrate 11 to which the terminals 12 are connected. Connection is typically by any conventional technique which includes thermal compression bonding and solder reflow methods.

Figure 4:
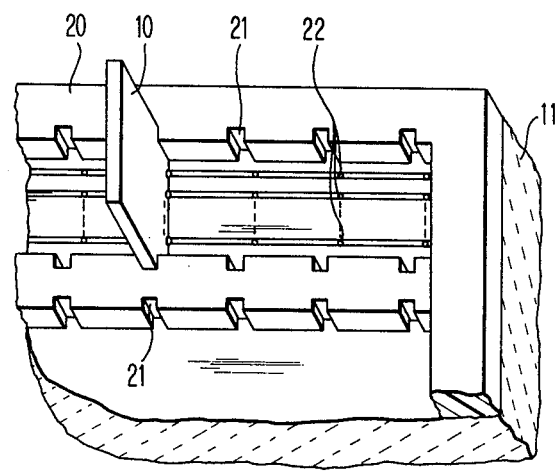
FIG. 4 Illustrates one form of a support and locater frame which is useful in positioning integrated circuit chips onto the substrate prior to joining the integrated circuit chips to the substrate.

Under certain conditions the semiconductor chips 10 may require physical support other than the bonds to the substrate. Under these conditions various types of support structures may be provided. One type of support structure is a foot 14 which may be composed of an insulator material or a electrically conductive material. The foot 14 can be used to bring power or substrate bias into the back of the chip 10 in which case the material is a conductive metal. The foot 14 may be attached by conventional bonding techniques which include solder reflow, thermal compression bonding, or the like. Where the foot is a dielectric material the use of a suitable adhesive material is required. Other support means could include a support frame which is shown in FIG. 4 that would hold the side edges of each semiconductor chip. A further possible support (not shown) would be to position the semiconductor chips 10 into grooves or trenches in the substrate 11. Such grooves may be formed by machine techniques or where the substrate 11 is composed of a multilayer ceramic and metallurgy structure, the grooves may be built up in the green sheet prior to firing to form the final sintered multilayered ceramic substrate.

The vertical integrated circuit package may be used for memory, logic, microprocessor, programmable logic arrays and combinations thereof.

Memory integrated circuit chips are chips which have an array of memory cells with associated connections for addressing, input/output, control, timing and powering. Logic chips contain interconnected logic circuits and possibly driver and receiver circuits and connection for input/output, clocks and powering. Microprocessors may be complex logic integrated circuit chips or chips which combine interconnected logic and memory arrays. They would have connections for input/output, control and clocking. Programmable logic arrays (PLA's) are a combination of logic and array which perform complex logic functions by programming the arrays. All of these chips that do not exceed the I/O limitations of the chosen chip joining technology would lend themselves to vertical packaging.

Figure 2:
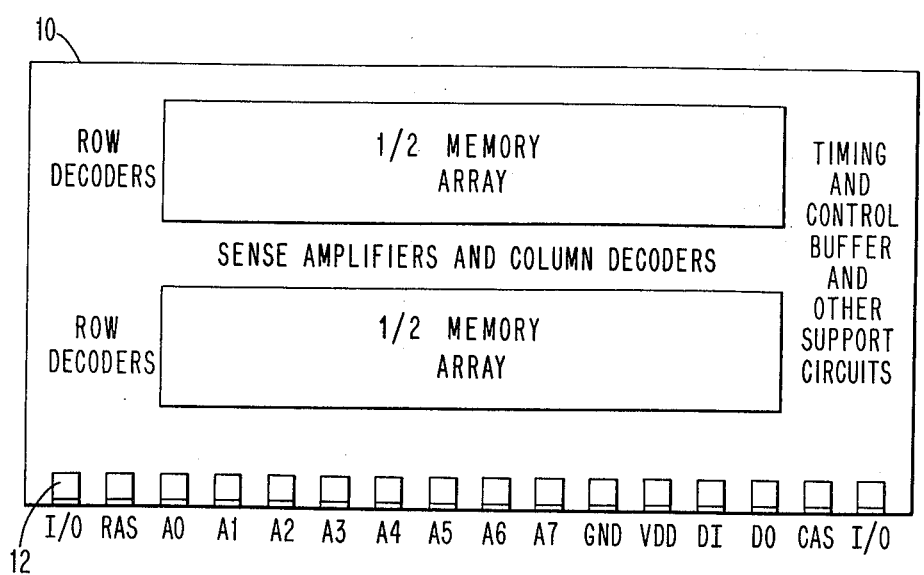
FIG. 2. Schematically illustrates a memory chip which is useful in the FIGS. 3A,B memory array.

FIG. 2 is an example of the layout of a random access memory integrated circuit chip. The memory chip 10 contains on one edge thereof signal and power terminals 12. The semiconductor chip in this example is a 64K by one integrated circuit memory chip designed to operate off of a single power supply which may be, for example, five volts. The input/output terminals required for this integrated circuit chip 10 are as follows: 2 internally connected input/output (I/O), 1 row address select (RAS), 8 bit address (A0 to A7), 1 ground (GND), 1 supply voltage (VDD), 1 data input-write (DI), 1 data out-read (DO), and 1 address select (CAS). The 8 address lines sequentially read a 16 bit address into the semiconductor chip 10, one when the row address line is selected and the other when the column address line is selected. The total 16 bit address permits a selection of one of the 64K bits on the semiconductor chip.

The memory integrated circuit chip 10 is preferably laid out so that the longest length of the memory array area is parallel to the one edge that contains the terminal 12. In the chip illustrated, the memory array is divided into two one-half memory arrays with their sense amplifiers and column decoders in between. The row decoders for each one-half memory array are associated on one side of the memory arrays; and the timing and control, buffer and other support circuits are located on the other side of the memory array areas. This memory layout is advantageous because it reduces the length of connections between the various circuits to the one edge containing the signal and power input and output terminals. The shape of the memory integrated circuit is rectangular with the signal and power terminals located along the longest side of the integrated circuit chip 10. This chip is typically several hundred mils on each side. One typical semiconductor memory chip might have a chip dimension of 3.6 milimeters by 7.0 milimeters. With a chip of this dimension and the sixteen terminals 12 described, there would result in a center-to-center terminal spacing along the long edge of 7 milimeters of 0.4375 milimeters. This is a very adequate distance when using solder connections or thermal compression bonding connections.

TABLE 1

| Terminals | 15 | 18 | 19 | 20 | 22 |

TABLE 1-continued

| Terminals with 2 I/Os | 16 | 19 | 20 | 21 | 23 |
|---|---|---|---|---|---|
| Memory Bits Per Chip | 64K | 256K | 512K | 1024K | 4096K |
| | $2^{16}$ | $2^{18}$ | $2^{19}$ | $2^{20}$ | $2^{22}$ |
| Binary Inputs to Address | 16 | 18 | 19 | 20 | 22 |
| Addresss Bits | 8 | 9 | 10 | 10 | 11 |

The Table 1 illustrates how the increase in memory bits per integrated circuit chip requires additional terminals. The addition of only one address line results in 18 bit addressing for a 256K bit integrated circuit chip. The addition of two more address lines for a total of 10 permits 1024K bits to be addressed. It is, therefore, readily seen that there is much growth potential possible in memory capacity with only a small number of terminals involved. In the organization described there is one input/output line in the integrated circuit chip with this line acting as an input for a data in (write) and output for a data out (read).

Memory packages carrying edge mounted integrated circuit chips are well suited to the bus oriented architecture typical of memory array integrated chip interconnection. As an example, the organization of a memory module containing 72 integrated circuit chips may be considered. For most effective error correction it is desirable not to have more than one bit for a word on an integrated circuit chip resulting in a 64K bit by 1 integrated circuit chip organization. A large computer could work with a 72 bit word and a possible organization would be to have the module contain all of the bits of that word, that is 72 bits. This generally is undesirable from a power aspect in that it requires that all of the integrated circuit chips on that module be simultaneously powered. Several alternatives would include having 36 bits of a word on a module (module half-powered), 18 bits forming a word in a module (module one-quarter powered) or 9 bits of a word on a module (module one-eighth powered). The number of pins required for each module for each of these four organizations and previously defined integrated chip organization are shown in the following Table 2.

TABLE 2

| Function | 72 × 1 | 36 × 2 | 4 × 18 | 8 × 9 |
|---|---|---|---|---|
| Address | 8 | 8 | 8 | 8 |
| RAS | 1 | 2 | 4 | 8 |
| CAS | 1 | 2 | 4 | 8 |
| DI | 1 | 1 | 1 | 1 |
| DO | 1 | 1 | 1 | 1 |
| VDD | 1 | 1 | 1 | 1 |
| GND | 1 | 1 | 1 | 1 |
| Input/Output | 72 | 36 | 18 | 9 |
| Total Mod. Pins | 86 | 52 | 38 | 37 |
| Max. # Chips Simult. Powered | 72 | 36 | 18 | 9 |

From this it can be seen that the preferred organizations are 4×18 integrated circuit chips or 8×9 integrated circuit chips.

Figure 3A:
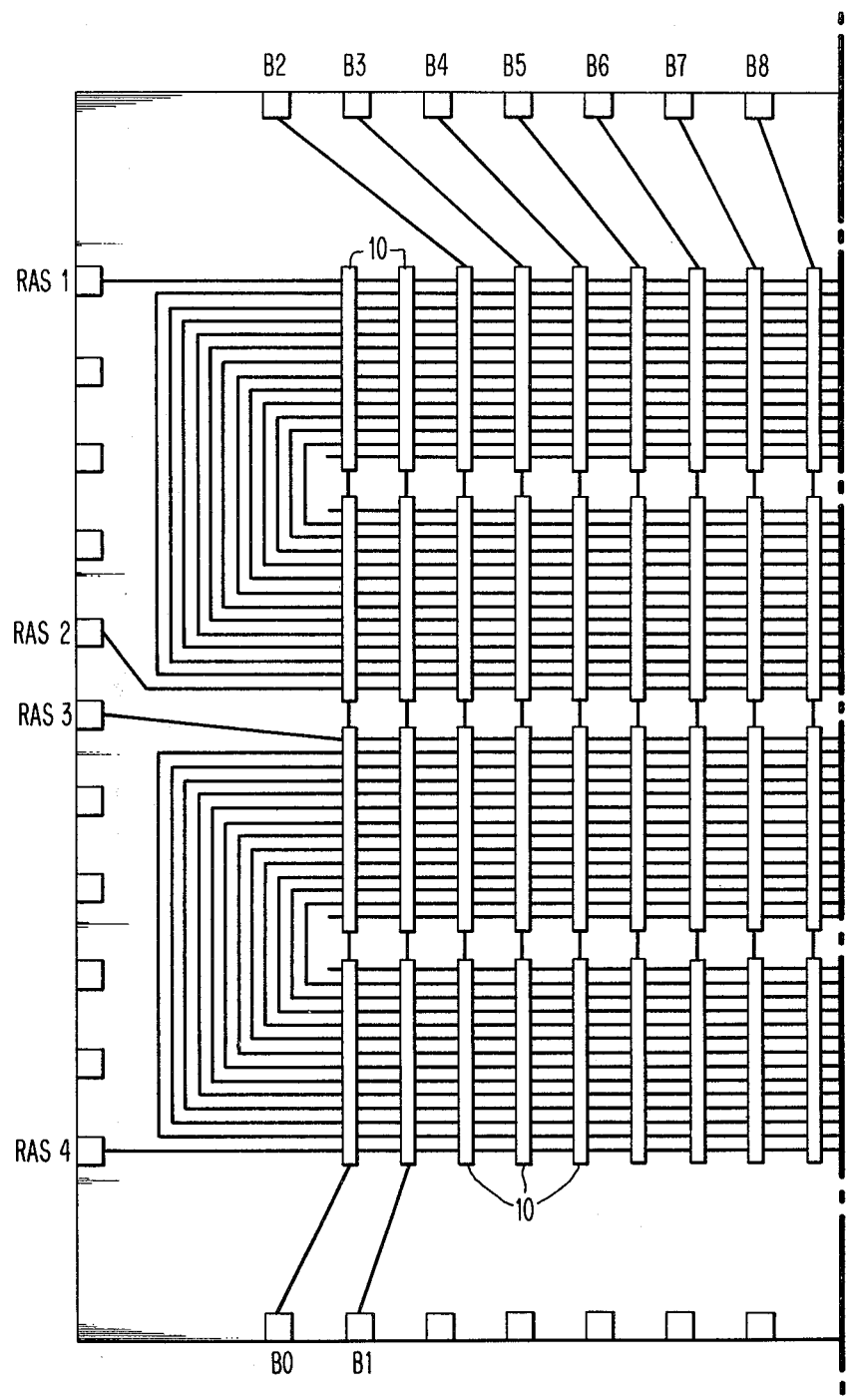
FIGS. 3A and 3B Show a greatly enlarged layout of a memory array of integrated circuit chips of four by eighteen vertically mounted integrated circuit chips according to the present invention.
Figure 3B:
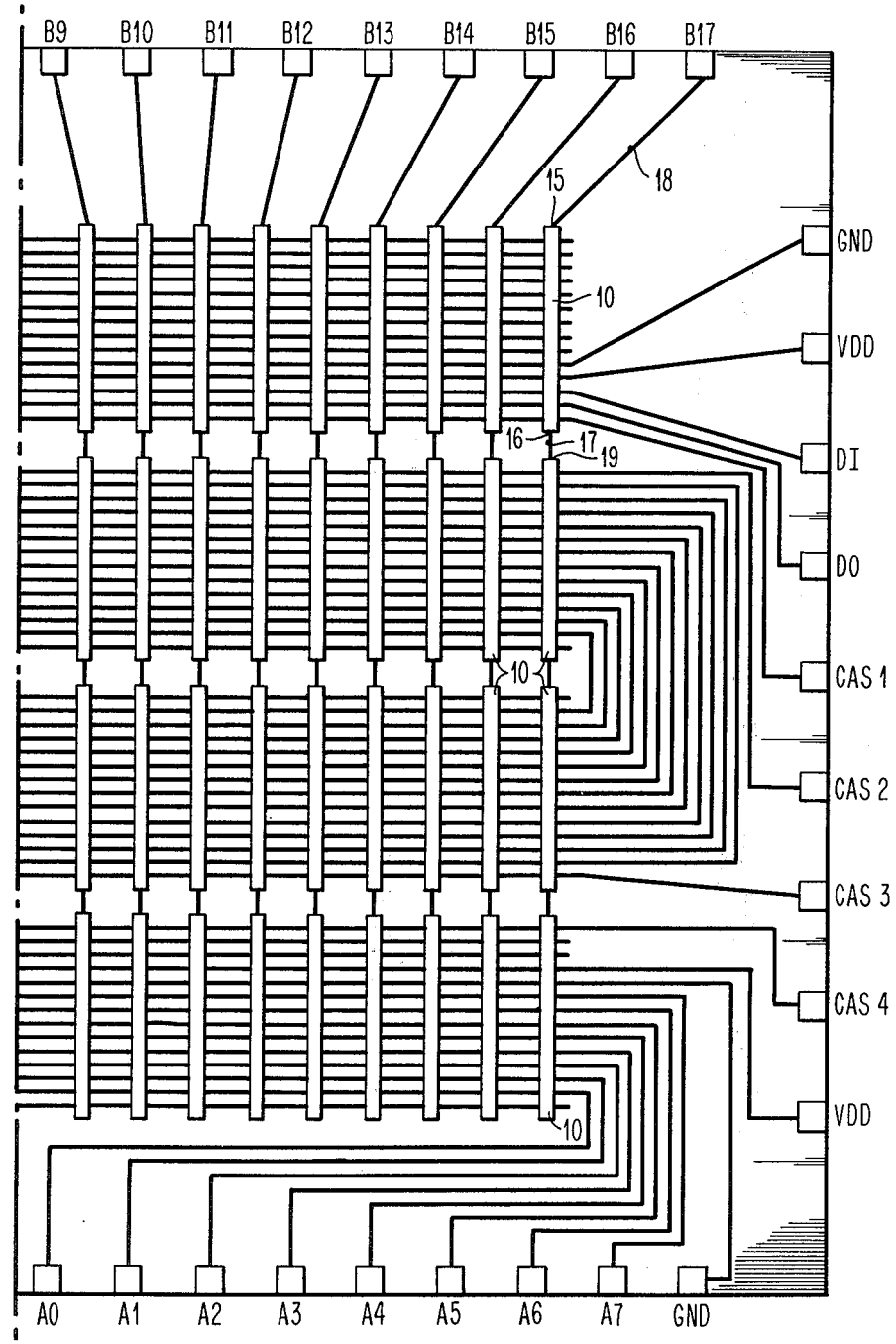

FIG. 3 illustrates the wiring required for the 4×18 integrated circuit chip organization on the substrate 11. Along the periphery of FIG. 3 are squares that represent input/outputs, such as pins, to the vertical semiconductor integrated chip memory package. The pins B0 through B17 represent the 18 bit lines and connect to the common I/O of the 4 chips. The remaining identified pins are electrically attached to 14 bus lines which connect to the four rows of 18 integrated circuit chips in a column. The first column of integrated circuit chips (as seen from the left of the drawing) has each of the integrated circuit chips facing torward the bottom of the page. The second column has the integrated circuit chips facing toward the top of the page. The third column has the integrated circuit chips facing toward the bottom of the page and the fourth column has the integrated circuit chips facing toward the top of the page. This array of memory integrated circuit chips may be contained in a substrate area of approximately 34×34 milimeters. Each column of integrated circuit chips has their input/output lines dotted or connected together. The total number of pins required in this module is 38 with two duplicate pins being used for power and ground. The 18bit lines of the module would represent two bytes of a word (a byte is typically 9 bits).

The two I/O terminals on each IC chip are shown, for example, as 15 and 16 in FIG. 3. These terminals are internally connected to one another. Terminal 15 is also connected to B17 by wiring 18 on the substrate. Terminal 16 connects to conductive wiring 17 on substrate 11. The wiring 17 connects to the I/O terminal of the next memory integrated circuit chip. In this way the I/Os of the four IC chips in the four columns are connected together. It is necessary to have the 2 I/Os on each chip which therefore requires 16 connections rather than 15 connections, as indicated in Table 1, to allow one level of metallurgy on the substrate. If two layers of metallurgy are used on the substrate such as by use of a multilayer ceramic substrate, 15 chip connection may be used.

The vertical connected integrated circuit chip package is also particularly suited to fabricating and providing terminals to integrated circuits fabricated on both sides of an integrated circuit chip. In the simplest form the structure provides a substrate connection between the integrated circuit and the carrying substrate, and in its most complex form the integrated circuit would have circuits fabricated in both sides of the integrated circuit chip. In this manner combinations of logic and memory, or the like circuits, may be formed on one side or the other.

Figure 5A:
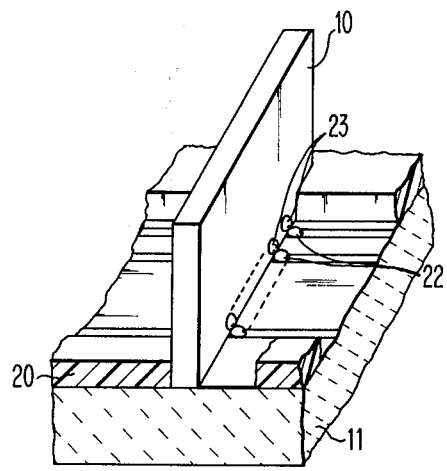
FIGS. 5A and 5B Illustrate a method for solder reflow joining vertically oriented integrated circuit chips to the substrate.
Figure 5B:
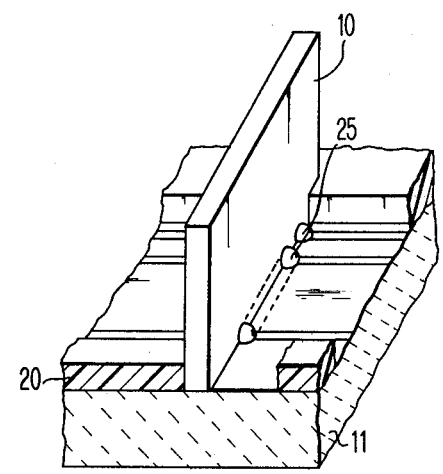

The methods for solder reflow connection of vertically oriented chips to a substrate may be more fully understood with reference to FIGS. 4, 5A and 5B. FIG. 4 illustrates a support and locater frame 20 which hold integrated circuit chips 10 in proper location by means of slots 21 at the edges of the integrated circuit chips 10. The integrated circuit chips 10 are loaded in the support frame 20 and positioned on the suitable substrate 11 which has contacts 22 thereon. The frame can be made of punched ceramic sheet and perhaps co-fired with a multilayer ceramic substrate, or the like, or alternatively, molded of a high temperature plastic.

FIG. 5A is a greatly enlarged schematic illustration of a vertically mounted semiconductor chip having solder balls 23 on each of the signal and power terminals of the semiconductor chip 10. Solder balls 22 are also located on the substrate connections. The solder may be lead-tin or indiun-lead, or the like. The regions around the solder are non-wettable by the solder. The structure is placed in an oven held at a temperature above the melting point of the solder, and the solder is reflowed to produce connections 25, as shown in FIG. 5B.

Figure 6A:
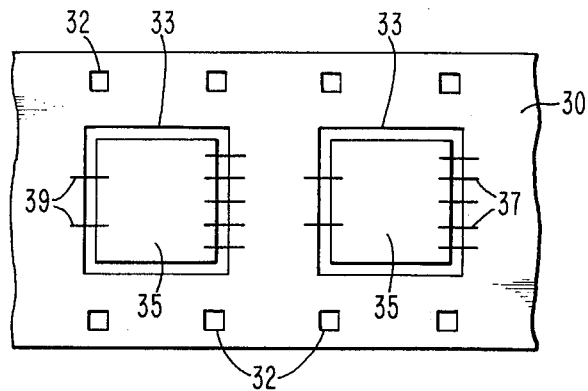
FIGS. 6A through 6F Illustrate a method for thermal compression vertically bonding integrated circuit chips to the substrate to form the vertical package of the present invention.
Figure 6B:
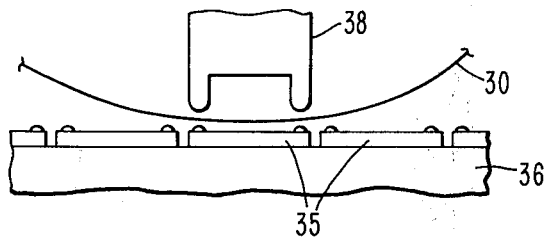
Figure 6C:
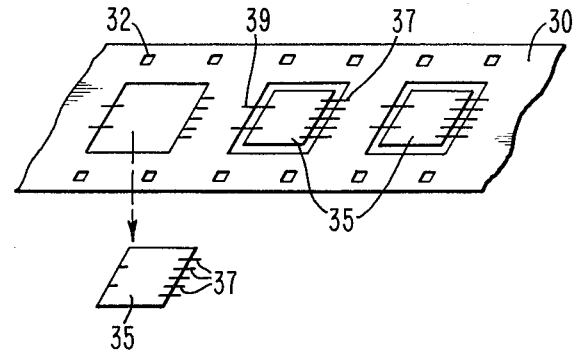

The method for thermal compression bonding semiconductor chips from a tape carrier lead frame structure is illustrated in FIGS. 6A through 6F. FIG. 6A shows the lead frame tape carrier 30 with sprocket openings 32 therein. The tape carrier 30 has openings 33 where the semiconductor integrated circuit chips are to be carried. The sprockets 32 allow the tape carrier 30 to be mechanically moved across a semiconductor wafer that has had its semiconductor chips 35 diced and supported on a substrate 36. The semiconductor chips 35 are typically adherent to the substrate by a low melting wax material (not shown). The input/output metal leads 37 bridge the gap in the opening 33 from the tape carrier 30 to the semiconductor chip 35, as shown in FIG. 6A. There are dummy connections 39 which cross the gap between the tape carrier and the semiconductor chip 35. These dummy connections act to support the semiconductor chip within the tape carrier after the bonding of the chip to the input/output leads 37 and dummy connections 39. FIG. 6B illustrates the side view of FIG. 6A with the addition of a thermal compression bonding tool 38. These semiconductor chips are attached to the lead frame by thermal compression bonding using a heated tool 38. The semiconductor chip is released from the surface 36 by the melting of the wax material during the thermal compression bonding process. The result is shown in FIG. 6C wherein a plurality of semiconductor chips 35 are carried by the tape carrier 30. FIG. 6C also schematically shows the cutting of one semiconductor chip 35 from the tape carrier 30 wherein the dummy leads 39 are cut flush to the edge of the semiconductor chip 35 and the input/output leads on one edge of the chip are allowed to extend beyond the edge of the chip as illustrated.

Figure 6D:
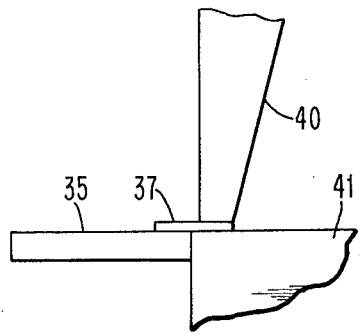
Figure 6E:
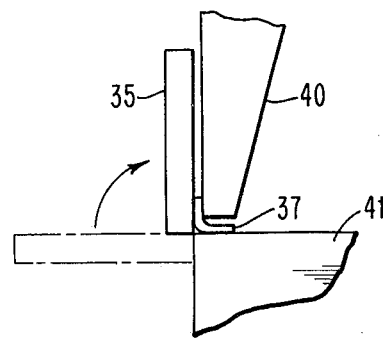
Figure 6F:
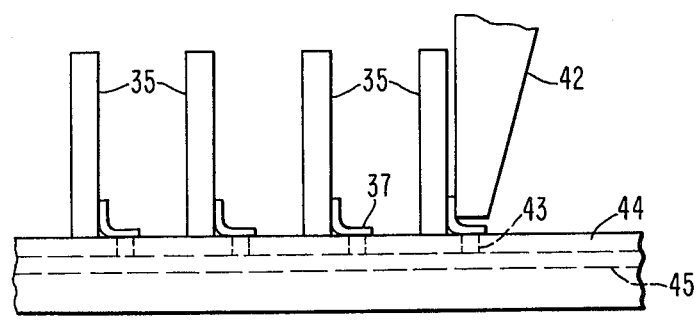

The semiconductor integrated circuit chips 35 which are cut from the tape carrier 30 are required to have their input/output leads 37 on one edge of the integrated circuit chip bent to a right angle as shown in FIGS. 6D, 6E and 6F. The leads 37 of the integrated circuit chip 35 are held between the surfaces 40 and 41 in a suitable tool as shown in FIG. 6D. The integrated circuit chip 35 is then moved as indicated by the arrow in FIG. 6E to form the lead 37 at right angles to the integrated circuit chip 35. The plurality of integrated circuit chips 35 having the leads 37 bent at right angles to the integrated circuit chip are loaded in, for example, the support and locater frame of FIG. 4, and the frame positioned on a substrate 11, as illustrated in FIG. 6F. The support and locater frame is not shown in FIG. 6F for simplicity sake. A thermal compression bonding tool 42 thermal compression bonds the input/output lead 37 to electrical connections 43 on the surface of the multilayer metal-ceramic substrate 44. The various semiconductor integrated circuit chips 35 are electrically interconnected via connectors 43 and metal conductor 45 buried within the multilayer ceramic structure 44.

FIGS. 7A through 7D show a further embodiment of the invention wherein a three dimensional interconnection system is possible. The integrated circuit chips 50 are thermal compression bonded to the tape carrier 52 in a similar manner to that described in connection with FIGS. 6A and 6B. Sprockets openings 53 are present to effect movement of the tape carrier 52 as described in the FIG. 6 process. The integrated circuit chips 50 are located in openings 54. However, input/output leads 55 may be present from all four sides of the integrated circuit chip 50. A further slotted opening 56 is associated, for example, with every other semiconductor chip 50 and opening 54. This opening 56 will contain leads 57 which will ultimately be bonded to the carrying substrate.

Figure 7A:
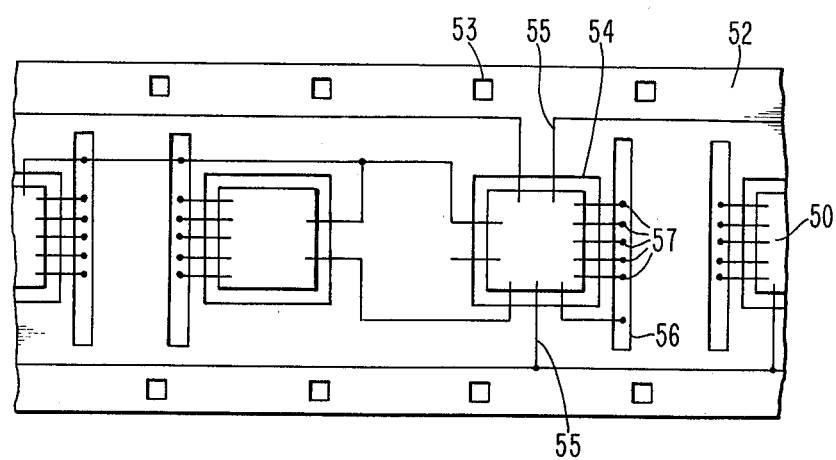
FIGS. 7A through 7D Illustrate the method of forming a vertical semiconductor chip package wherein a convoluted tape carrier is used to carry the vertically oriented integrated circuit chips of the present invention.
Figure 7B:
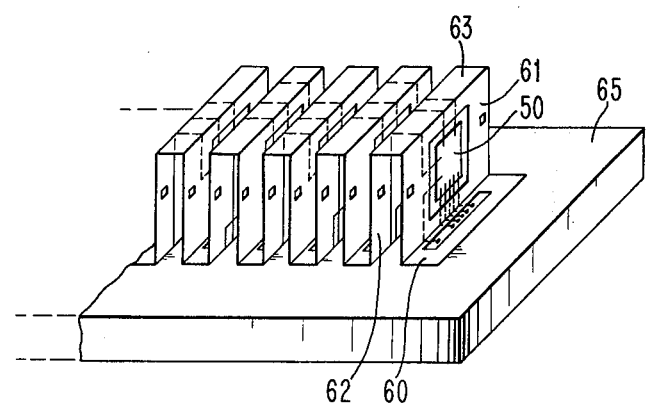
Figure 7C:
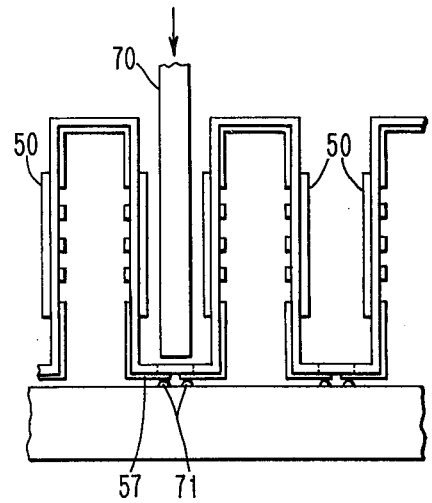
Figure 7D:
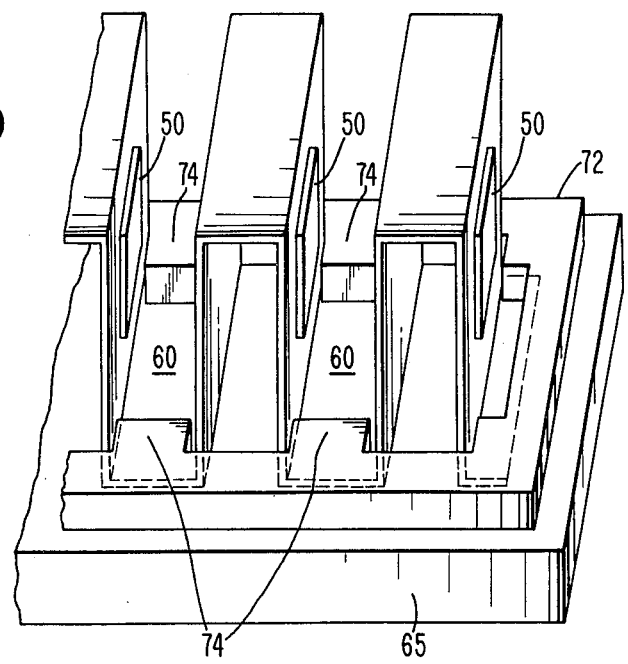

The tape carrier 50 is then folded into a convoluted form of a recurring fold structure. The recurring fold structure includes, as seen in FIG. 7B, a lower horizontal region 60, a first 61 and second 62 vertical regions and a higher horizontal region 63. These regions are connected to one another with the lower region 60 being connected to and perpendicular to the first vertical region 61. The first vertical region 61 being connected to and perpendicular to the higher horizontal region 63 on the opposite side to the lower horizontal region 60. The higher horizontal region 63 is connected to and perpendicular to the second vertical region 62 on the opposite side to the first vertical region 61. The first and second vertical regions 61 and 62 are parallel to one another, and the second vertical region 62 is connected to and perpendicular to the lower horizontal region in the next recurring structure on the side opposite to the higher horizontal region 63. At least one, and preferably both of the first and second vertical regions 61 and 62 will carry a semiconductor chip therein which will be substantially vertical in relation to the carrying substrate 65. The tape carrier of the recurring fold structure is bonded to the substrate 65 by physically and electrically attaching the lead frame conductors 57 by preferably thermal compression bonding to conductors on or in the substrate 65. The various integrated circuit chips 50 are interconnected by leads 55 which are preferably inside of the convoluted tape carrier structure, as indicated by the dashed lines in the FIG. 7B. The substrate 65 can be of the multilayer ceramic and metal type structure wherein the metal conductive layers are within the substrate 65, or metal layers could be on the surface of the substrate structure. FIG. 7C illustrates the use of a thermal compression bonding tool 70 attaching input/output conductor 57 to the substrate connection 71. The thermal compression bonding tool would move sequentially from one semiconductor integrated circuit chip bonding region on the lower horizontal region to the next lower horizontal region. FIG. 7D shows the addition of a comb-shaped support frame 72 with teeth 74 of the comb holding the lower region 60 of the recurring integrated circuit chip tape carrier against the substrate 65 in a permanent manner. The frame 72 may be attached thereto by a suitable adhesive material.

While the invention has been particularly shown and described with reference to the preferred embodiment thereof, it will be understood by those skilled in the art that various changes in form and detail may be made therein without departing from the spirit and scope of the invention.

Having thus described my invention, what I claim as new, and desire to secure by Letters Patent is:

1. A vertical semiconductor chip package comprising:
   a substrate;
   a semiconductor integrated circuit chip having two major faces and four edges with its signal and power terminals located on one edge of the chip; and
   said semiconductor chip is electrically and physically connected to said substrate at said one edge of said chip by suitable physical connections to electrical paths on or in said substrate for signal interconnection and power distribution to and from the semiconductor chip, and for physical support of the chip.

2. The vertical package of claim 1 wherein said electrical and physical connections to said electrical paths on or in said substrate is by solder connections.

3. The vertical package of claim 1 wherein said electrical and physical connections to said electrical paths on or in said substrate is by thermal compression bonding.

4. The vertical package of claim 1 wherein said semiconductor chip is physically supported by means other than said electrical and physical connections at one edge of said semiconductor chip.

5. The vertical package of claim 4 wherein the said support means other than the connections at one edge of said semiconductor chip is a support frame holding said chip at its side edges.

6. The vertical package of claim 1 wherein said integrated circuit chip contains memory circuitry in and on at least one of said major surfaces and having the longest length of the memory array area parallel to said one edge.

7. The vertical package of claim 1 wherin said semiconductor chip contains integrated circuits on and in said both major surfaces of said chip.

8. A vertical semiconductor chip package comprising:
a substrate;
a plurality of integrated circuit chips bonded to a tape carrier;
said tape carrier being in a convoluted form with all said integrated circuit chips positioned substantially vertical;
said tape carrier being electrically and physically bonded to said substrate in areas associated with said integrated circuit chips so that said substrate is substantailly horizontal with respect to said vertical positioned integrated circuit chips; and
each of said plurality of chips is located within an opening in said tape carrier with metal leads physically and electrically connected to the said chips across the said opening between said chip and said tape carrier.

9. The vertical package of claim 8 wherein said electrical and physical bonds to said substrate are thermal compression bonds.

10. The vertical package of claim 8 wherein metal leads physically and electrically connect one of said plurality of chips with others of said plurality of chips by leads on the said tape carrier.

11. The vertical package of claim 8 wherein said metal leads act as electrical connections to said chip on more than one of the sides of said chip.

12. The vertical package of claim 8 wherein a comb-shaped support frame having teeth holds said convoluted tape carrier to said substrate by means of the said teeth of said comb-shaped support against portions of the said tape carrier touching said substrate.

13. A vertical semiconductor chip package comprising:
a substrate;
a tape carrier with semiconductor chips located in openings in said carrier and physically and electrically attached to lead frame conductors which are carried on said carrier and are thermo compression bonded to said chips;
said tape carrier is in a convoluted form of a recurring fold structure;
said recurring structure includes a lower horizontal region, first and second vertical regions and a higher horizontal region;
said regions are connected to one another with the said lower region being connected to and perpendicular to said first vertical region, said first vertical region being connected to and perpendicular to said higher horizontal region on the opposite side to said lower horizontal region, the said higher region being connected to and perpendicular to said second vertical region on the opposite side to said first vertical region, said first and second vertical regions are parallel to one another, and said second vertical region being connected to and perpendicular to the lower horizontal region in the next said recurring structure on the side opposite to said higher region;
at least one of said first and second vertical regions carry a semiconductor chip therein; and
said tape carrier of said recurring fold structure is bonded to said substrate by physically and electrically attaching said lead frame conductors on said lower horizontal region of said recurring structure to conductor on or in said substrate.

14. The vertical package of claim 13 wherein said chips are electrically connected to said tape carrier on more than one side of said chips.

15. The method of forming a vertical semiconductor chip package comprising:
providing a tape carrier with semiconductor chips located in openings in said carrier and physically and electrically attached to lead frame conductors which are carried on said carrier and are thermo compression bonded to said chips;
folding said tape carrier into a convoluted form of a recurring fold structure;
said recurring structure includes a lower horizontal region, first and second vertical regions and a higher horizontal region;
said regions are connected to one another with the said lower region being connected to and perpendicular to said first vertical region, said first vertical region being connected to and perpendicular to said higher horizontal region on the opposite side to said lower horizontal region, the said higher region being connected to and perpendicular to said second vertical region on the opposite side to said first vertical region, said first and second vertical regions are parallel to one another, and said second vertical region being connected to and perpendicular to the lower horizontal region in the next said recurring structure on the side opposite to said higher region;
at least one of said first and second vertical regions carry a semiconductor chip therein; and
bonding said tape carrier of said recurring fold structure to a substrate by physically and electrically attaching lead frame conductors on said lower horizontal region of said recurring structure to conductors on or in said substrate.

16. The method of claim 15 wherein said chips are electrically connected to said tape carrier on four sides of said chips.

17. The method of claim 15 and further comprising:
positioning a comb-shaped support frame with the teeth of the comb holding said lower region of said recurring structure against said substrate and permanently fixing said frame to said substrate.

* * * * *